(12) United States Patent
Liu et al.

(10) Patent No.: US 8,053,357 B2
(45) Date of Patent: *Nov. 8, 2011

(54) PREVENTION OF POST CMP DEFECTS IN CU/FSG PROCESS

(75) Inventors: Chung-Shi Liu, Hsin-Chu (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 122 days.

This patent is subject to a terminal disclaimer.

(21) Appl. No.: 11/463,515

(22) Filed: Aug. 9, 2006

(65) Prior Publication Data

US 2006/0292860 A1 Dec. 28, 2006

Related U.S. Application Data

(62) Division of application No. 10/791,014, filed on Mar. 2, 2004, now Pat. No. 7,091,600, which is a division of application No. 09/863,223, filed on May 24, 2001, now Pat. No. 6,723,639.

(51) Int. Cl.
- H01L 21/4763 (2006.01)
- H01L 23/48 (2006.01)
- H01L 23/52 (2006.01)
- H01L 29/40 (2006.01)

(52) U.S. Cl. ........ 438/633; 438/629; 438/634; 438/645; 257/752; 257/E21.582

(58) Field of Classification Search .................. 438/624, 438/629, 645, 637, 633; 257/752, E21.582
See application file for complete search history.

(56) References Cited

U.S. PATENT DOCUMENTS

| | | | |
|---|---|---|---|
| 5,635,423 A * | 6/1997 | Huang et al. | 438/638 |
| 6,008,120 A | 12/1999 | Lee | |
| 6,037,258 A * | 3/2000 | Liu et al. | 438/687 |
| 6,103,601 A | 8/2000 | Lee et al. | |
| 6,121,164 A | 9/2000 | Yieh et al. | |
| 6,130,157 A | 10/2000 | Liu et al. | |
| 6,136,680 A | 10/2000 | Lai et al. | |
| 6,150,272 A | 11/2000 | Liu et al. | |
| 6,165,915 A * | 12/2000 | Jang | 438/787 |
| 6,191,030 B1 * | 2/2001 | Subramanian et al. | 438/636 |
| 6,211,061 B1 * | 4/2001 | Chen et al. | 438/622 |
| 6,232,217 B1 * | 5/2001 | Ang et al. | 438/624 |
| 6,251,781 B1 * | 6/2001 | Zhou et al. | 438/687 |
| 6,319,814 B1 * | 11/2001 | Tsai et al. | 438/624 |
| 6,723,639 B1 * | 4/2004 | Liu et al. | 438/672 |
| 2001/0055880 A1 * | 12/2001 | Li et al. | 438/690 |

OTHER PUBLICATIONS

Wolf et al., Silicon Processing for the VLSI Era, vol. 1, pp. 742-743, Lattice Press, 2000.*

* cited by examiner

Primary Examiner — David S. Blum
Assistant Examiner — Daniel Luke
(74) Attorney, Agent, or Firm — Haynes and Boone, LLP

(57) ABSTRACT

A common problem associated with damascene structures made of copper inlaid in FSG (fluorinated silicate glass) is the formation of defects near the top surface of the structure. The present invention avoids this problem by laying down a layer of USG (undoped silicate glass) over the surface of the FSG layer prior to patterning and etching the latter to form the via hole and (for a dual damascene structure) the trench. After over-filling with copper, the structure is planarized using CMP. The USG layer acts both to prevent any fluorine from the FSG layer from reaching the copper and as an end-point detector during CMP. In this way defects that result from copper-fluorine interaction do not form and precise planarization is achieved.

20 Claims, 4 Drawing Sheets

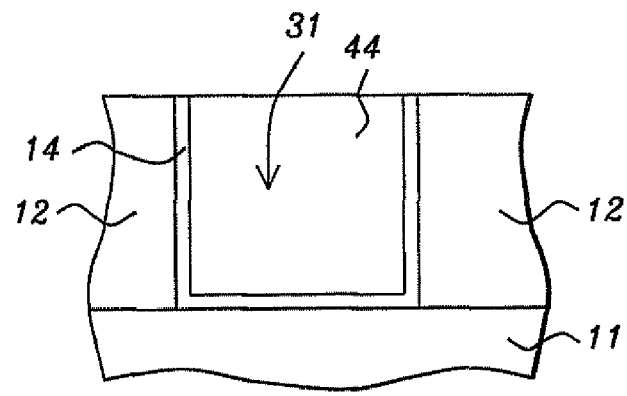
*FIG. 1a - Prior Art*
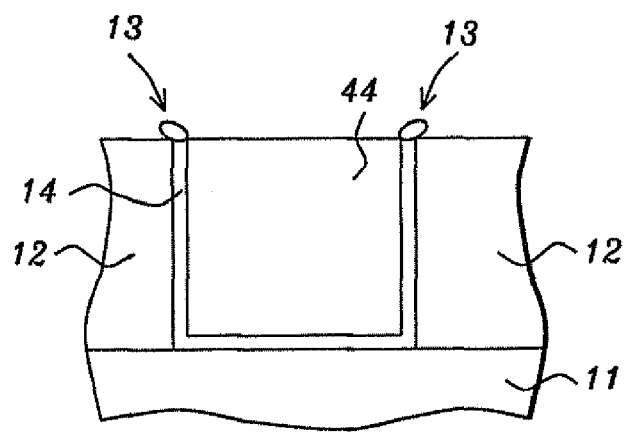
*FIG. 1b - Prior Art*
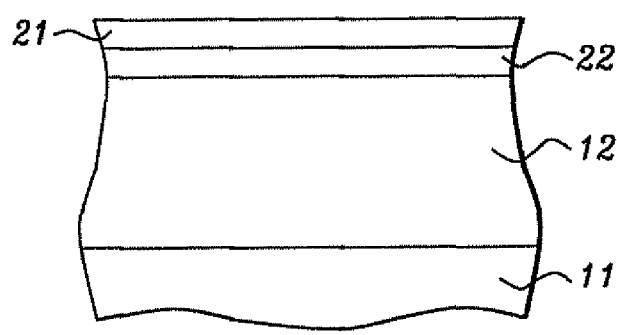
*FIG. 2*

PREVENTION OF POST CMP DEFECTS IN CU/FSG PROCESS

DOMESTIC PRIORITY CLAIM

This application is a divisional of U.S. patent application Ser. No. 10/791,014 filed Mar. 2, 2004, and entitled, "Prevention of Post CMP Defects in CU/FSG Process," which is a divisional of U.S. patent application Ser. No. 09/863,223 filed May 24, 2001, now U.S. Pat. No. 6,723,639, and entitled, "Prevention of Post CMP Defects in CU/FSG Process," which are hereby incorporated by reference in their entirety.

FIELD OF THE INVENTION

The invention relates to the general field of semiconductor device manufacture with particular reference to etching via holes and wiring channels in fluorine-bearing dielectrics, followed by chem.-mech. polishing.

BACKGROUND OF THE INVENTION

As integrated circuits grow ever smaller and faster, delays associated with the wiring, as opposed to the active devices, have become increasingly more important. To reduce said delays it is necessary to reduce the resistance of the wires and/or the capacitance per unit length across the inter-metal dielectrics. Wire widths in integrated circuits have, however, continued to shrink so the electrical conductivity of the wiring material itself has become increasingly more important. Thus, aluminum, which has been the metal of choice since the integrated circuit art began, is now being increasingly replaced by copper.

Similarly, silicon dioxide, which has been the inter-metal dielectric (IMD) of choice since the integrated circuit art began, is now being increasingly replaced by new, low dielectric constant materials. An example of the latter is fluorinated silicon glass (FSG) which typically has a dielectric constant of about 3.5.

As might be expected, integrated circuits having both copper wiring and IMDs of FSG are now in active development at many locations. Before copper could be introduced into integrated circuits, one problem needed to be overcome, namely copper's tendency to be both a fast diffuser as well as a source of recombination centers in silicon. Although a number of materials were known to be effective barriers against copper diffusion at or near room temperature, they could not be relied upon when conventional multi-layering was used because of the difficulty of adequately covering the wiring's edges.

The wiring coverage problem was solved by the introduction of damascene wiring. The term damascene when used in connection with integrated circuit wiring, refers to the fact that a layer has been inlaid within a supporting medium, as opposed to being covered by it. Thus, instead of the wiring being laid down on top of the IMD, a trench is first formed in its surface and this trench then filled with copper. Lining the walls of the trench with a barrier layer prior to filling in with copper then becomes a straightforward procedure.

FIG. 1a is a schematic illustration of a damascene connector. Seen there is an FSG layer 12 on a substrate 11. Via hole 31 was etched through the full thickness of layer 12 so as to expose substrate 11 which, in most cases, would be the upper surface of a partially formed integrated circuit, and then just filled with copper material 44 (after laying down barrier layer 14). The filling step is accomplished by initially over-filling with copper and then removing the excess by means of chemical mechanical polishing (CMP).

Unfortunately, the fluoride ions in the FSG are not very strongly bound and a certain amount of free fluorine is able to react with the copper during the CMP process, resulting in the formation of defect structures 13 at the edges of the filled via hole, as illustrated schematically in FIG. 1b.

The present invention describes a structure, and process for making it, which overcomes this problem while still supporting copper damascene wiring on a FSG base.

A routine search of the prior art was performed with the following references of interest being found:

U.S. Pat. No. 6,008,120 (Lee) teaches use of the oxynitride ARC layer as the means for keeping fluoride away from the metal used to fill a via. Although there is an oxide cap over the oxynitride layer early in their process, they go to some trouble to selectively remove it from over the site of the fixture via hole. In U.S. Pat. No. 6,103,601, Lee et al. show how FSG films can be densified by hydrogen ion bombardment. The problem of etching a via hole through the FSG layer, filling it with copper and then planarizing by CMP is not discussed.

In U.S. Pat. No. 6,121,164, Yieh et al. are concerned with reducing stress in FSG layers. One approach they suggest is an overlying USG capping layer. Cu CMP is not part of their process. U.S. Pat. No. 6,130,157 (Liu et al.), and U.S. Pat. No. 6,136,680 (Lai et al.) show related patents while U.S. Pat. No. 6,150,272 (Liu et al.) show Cu CMP with FSG, using an organic layer over the FSG layer.

SUMMARY OF THE INVENTION

It has been an object of the present invention to provide single and dual damascene structures of copper and FSG.

Another object has been that said structures be free of defects near the copper-FSC interface that arise from an interaction between fluorine and copper.

A further object has been to provide a process for manufacturing the structures.

These objects have been achieved by laying down a layer of USG over the surface of the FSG layer prior to patterning and etching the latter to form the via hole and (for a dual damascene structure) the trench. After over-filling with copper, the structure is planarized using CMP. The USG layer acts both to prevent any fluorine from the FSG layer from reaching the copper and as an end-point detector during CMP. In this way defects that result from copper-fluorine interaction do not form.

BRIEF DESCRIPTION OF THE DRAWINGS

FIG. 1a illustrates a typical single damascene structure of the prior art.

FIG. 1b shows how defects can form near the edges of the copper filler for structures processed according to the teachings of the prior art.

FIGS. 2-5 show the manufacturing process and resulting structure of a single damascene connector made according to the teachings of the present invention.

DESCRIPTION OF THE PREFERRED EMBODIMENTS

The present invention is applicable to both single and dual damascene structures. FIGS. 1a and 1b are examples of the former. Referring now to FIG. 2, the starting point of the process of the present invention is the provision of FSG layer 12 on substrate 11. This layer is deposited to a thickness between about 2,000 and 10,000 Angstroms and contains between about 3 and 10 atomic % fluorine. Substrate 11 is usually (though not necessarily) a partially formed integrated circuit. The part that is inside the via hole could be a contact area on an active device or it could be wiring at the next level down.

Figure 3:
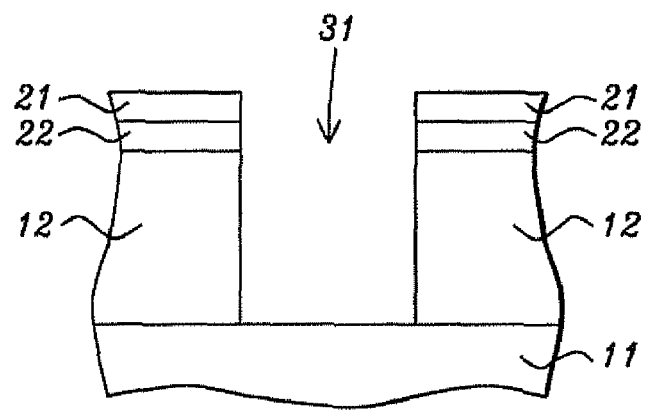

Then, as a key feature of the present invention, layer 22 of undoped silicate glass (USG) is deposited onto the upper surface of FSG layer 12. This layer is deposited to a thickness between about 0.1 and 0.2 microns. Its deposition is achieved by means of PECVD (plasma enhanced chemical vapor deposition) from silane or TEOS (tetra-ethyl-ortho-silicate) at about 400 C and it contains from 0 to about 2 atomic % fluorine. This is followed by the deposition of silicon oxynitride layer 21 which will serve as an anti-reflection coating (ARC). Then, using standard photolithographic processes, layers 21, 22, and 12 are patterned and then etched to form via hole 31 which extends to layer 11. This is shown in FIG. 3.

Figure 4:
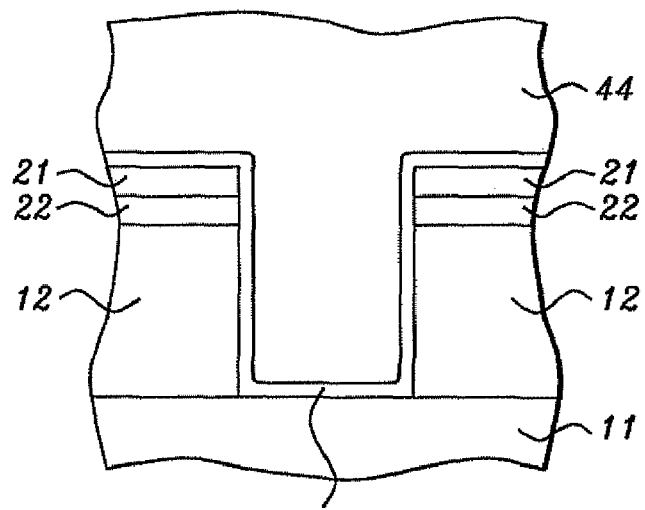

Referring now to FIG. 4, the next step is the deposition of barrier layer 14 on all walls of the via hole. This layer is between about 50 and 500 Angstroms thick and could be one of several possible materials such as tantalum, tantalum nitride, titanium nitride, and titanium silicon nitride. This is followed by the deposition of a copper seed layer (not shown) on barrier layer 14. Via hole 31 is then overfilled with copper 44, as shown.

Figure 5:
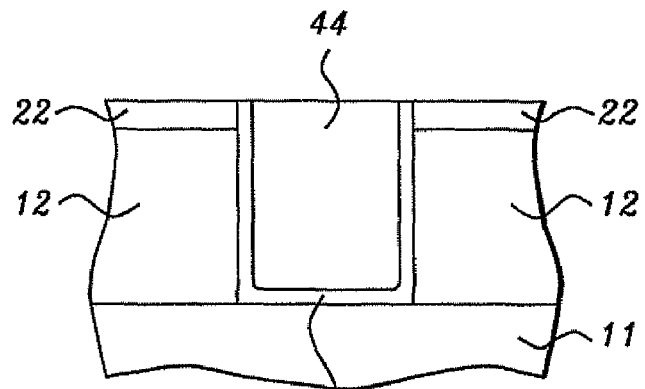

Then, as seen in FIG. 5, CMP is used to remove the excess copper with material removal continuing until USG layer 22 is reached. Note that, in addition to acting as a sink for fluoride ions coming out of the FSG layer, USG layer 22 is also being used as an optically based end-point detector for the CMP process.

Figure 6:
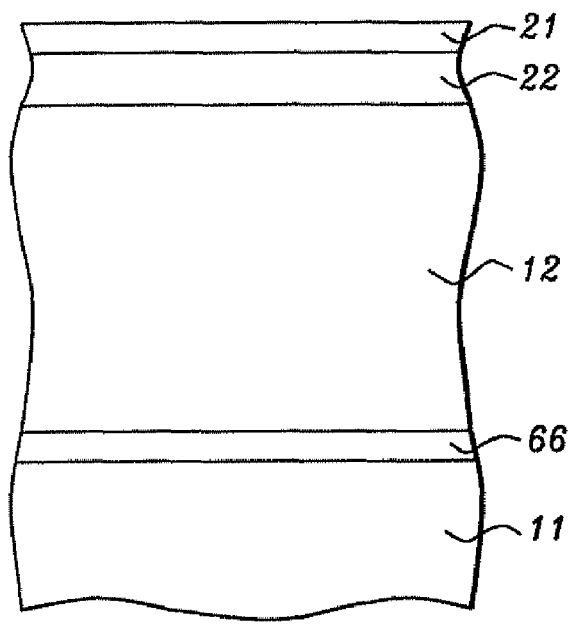
FIGS. 6-9 show the manufacturing process and resulting structure of a dual damascene connector made according to the teachings of the present invention.

The process of the present invention, as applied to a dual damascene structure, begins as schematically illustrated in FIG. 6. This is similar to FIG. 2 except that silicon nitride layer 66 has been deposited between substrate 11 and FSG layer 12. The thickness of this layer is between about 300 and 1,000 Angstroms. As for the single damascene case, USG layer 22 is deposited on the upper surface of FSG layer 12 followed by the deposition of silicon oxynitride layer 21, to a thickness between about 400 and 1,500 Angstroms, for use as an anti-reflection coating during photolithography.

Figure 7:
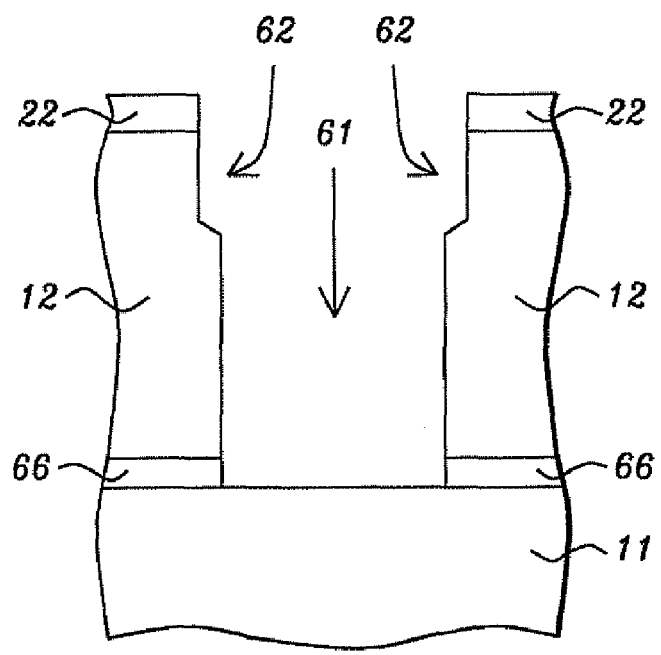

The next step comprises patterning and then fully etching layers 21, 22, and partly etching layer 12 to a depth of between about 0.2 and 2 microns, thereby forming trench 62 as shown in FIG. 7. Typically, the trench has a width between about 0.1 and 1 microns. A second patterning and etching step then follows during which layer 12 is further etched down to the etch stop silicon nitride layer 66, to form via hole 61 which typically has a width between about 0.1 and 0.6 microns and a depth between about 0.4 and 1 microns. Silicon nitride layer 66 is then selectively removed, during the course of which silicon oxynitride layer 21 also gets removed.

Figure 8:
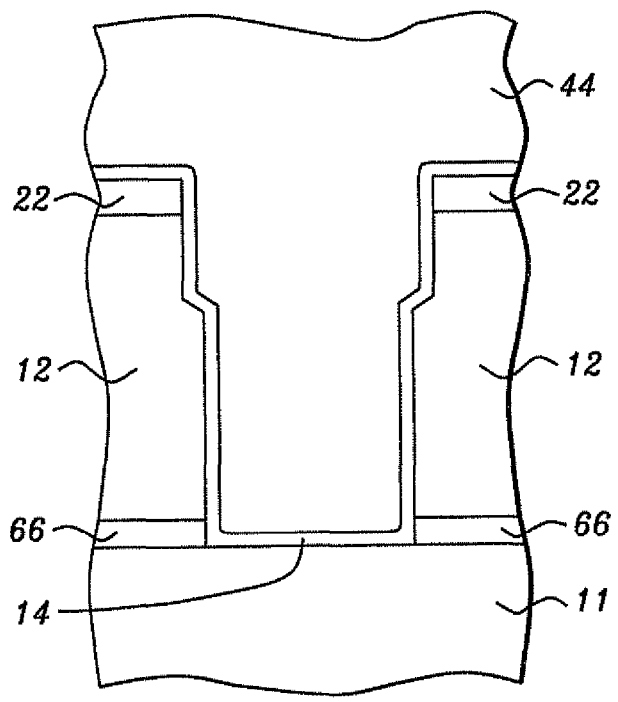

Referring now to FIG. 8, as was the case for the single damascene structure, barrier layer 14 is the deposition on all walls of the trench and the via hole. This is followed by the deposition of a copper seed layer (not shown) on barrier layer 14. Trench 62 and via hole 61 are then overfilled with copper 44, as shown in FIG. 8.

Figure 9:
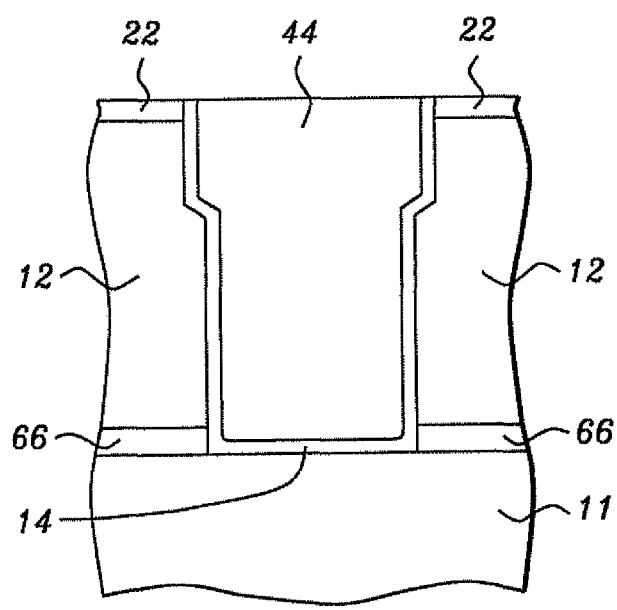

Then, as seen in FIG. 9, CMP is used to remove the excess copper with material removal continuing until USG layer 22 is reached. Note that, in addition to acting as a sink for fluoride ions coming out of the FSG layer, USG layer 22 is also being used as an optically based end-point detector since layer 14 is highly reflective while layer 22 is transparent.

While the invention has been particularly shown and described with reference to the preferred embodiments thereof, it will be understood by those skilled in the art that various changes in form and details may be made without departing from the spirit and scope of the invention.

What is claimed is:

1. A method for filling a via hole in a fluorinated silicate glass (FSG) layer comprising:
   depositing the FSG layer on a substrate, the deposited FSG layer having a thickness;
   forming an undoped silicate glass (USG) layer on the FSG layer without reducing the thickness of the deposited FSG layer;
   forming a mask layer over the USG and FSG layers, the mask layer being different than the USG and FSG layers;
   patterning the mask, USG, and FSG layers to form a via hole having walls;
   forming a metal barrier layer on the walls of the via hole;
   overfilling the via hole with a predetermined material; and
   removing, by a chemical mechanical polishing (CMP), the mask layer and the predetermined material until the USG layer is reached.

2. The method of claim 1, further comprising forming a seed layer on the walls of the via hole.

3. The method of claim 1, wherein depositing the FSG layer includes depositing the FSG layer to the thickness between about 0.2 and about 1 microns with between about 3 and about 10 atomic percent fluorine.

4. The method of claim 1, wherein forming the USG layer includes forming the USG layer to a thickness between about 0.1 and about 0.2 microns.

5. The method of claim 1, wherein forming the USG layer further includes using PECVD from silane or TEOS at about 400° C.

6. A method for forming a single damascene structure comprising:
   depositing a layer of fluorinated silicate glass (FSG) on a partially completed integrated circuit, the deposited FSG layer having a top surface;
   forming a layer of undoped silicate glass (USG) on the top surface of the deposited FSG layer;
   forming a mask layer over the USG and FSG layers, the mask layer including a layer of silicon oxynitride formed on the USG layer;
   patterning and the mask, USG, and FSG layers, thereby forming a via hole;
   forming a metal barrier layer on the walls of the via hole;
   overfilling the via hole with copper; and
   removing, by a chemical mechanical polishing (CMP), the copper until the USG layer is reached.

7. The method of claim 6, further comprising:
   forming a copper seed layer on the metal barrier layer.

8. The method of claim 7, wherein patterning the mask, USG, and FSG layers includes etching only the mask, USG, and FSG layers.

9. The method of claim 6, wherein forming the USG layer further includes using PECVD from silane or TEOS at about 400° C.

10. The method of claim 6, wherein forming the USG layer further includes forming the USG layer to a thickness between about 0.1 and about 0.2 microns.

11. The method of claim 6, wherein removing the copper until the USG layer is reached further includes using the USG layer as an optically based end-point detector for the CMP process.

12. A method for forming a dual damascene structure comprising:

depositing a layer of fluorinated silicate glass (FSG) over a partially completed integrated circuit;

forming a layer of undoped silicate glass (USG) on the FSG layer subsequent to depositing the FSG layer on the substrate;

forming a mask layer over the USG and FSG layers, the mask layer including a layer of silicon oxynitride formed on the USG layer;

etching the mask, USG, and FSG layers to form a trench;

etching the FSG layer to form a via hole within the trench, the via hole extending in a direction of the partially completed integrated circuit;

forming a metal barrier layer on walls of the via hole and on walls of the trench;

overfilling the via hole and the trench with copper; and removing, by a chemical mechanical polishing (CMP), the copper until the USG layer is reached.

13. The method of claim 12, further comprising forming a layer of silicon nitride on the partially completed integrated circuit;

wherein the FSG layer is deposited on the silicon nitride layer; and wherein etching the FSG layer to form the via hole includes using the silicon nitride layer as an etch stop layer.

14. The method of claim 13, further comprising selectively removing the silicon nitride layer that is exposed within the via hole prior to overfilling the via hole and the trench with copper.

15. The method of claim 13, wherein forming the layer of silicon nitride comprises forming the layer of silicon nitride to a thickness between about 300 and about 1,000 Angstroms.

16. The method of claim 12, further comprising:
forming a copper seed layer on the metal barrier layer.

17. The method of claim 12, wherein etching the mask, USG, and FSG layers to form the trench includes etching only the mask, USG, and FSG layers to form the trench.

18. The method of claim 17, wherein forming the layer of silicon oxynitride comprises forming the layer of silicon oxynitride to a thickness between about 400 and about 1,500 Angstroms.

19. The method of claim 12, wherein removing the copper until the USG layer is reached further includes optically detecting the USG layer through a change in reflectivity to stop the CMP process.

20. The method of claim 1, wherein forming the mask layer over the USG and FSG layers includes forming a layer of silicon oxynitride on the USG layer.

* * * * *